(12) United States Patent
Sherman et al.

(10) Patent No.: US 6,630,927 B2
(45) Date of Patent: Oct. 7, 2003

(54) KEYBOARD KEY DISCRIMINATION EMPLOYING DRIVE LINE/SENSE LINE COMBINATIONS AND ACCOMODATING SIMULTANEOUS KEY PRESS CONDITIONS

(75) Inventors: Nathan C. Sherman, Sammamish, WA (US); Dawson Yee, Redmond, WA (US); Christopher R. Bagin, Arlington, MA (US)

(73) Assignee: Microsoft Corporation, Redmond, WA (US)

( * ) Notice: Subject to any disclaimer, the term of this patent is extended or adjusted under 35 U.S.C. 154(b) by 142 days.

(21) Appl. No.: 09/783,285

(22) Filed: Feb. 15, 2001

(65) Prior Publication Data

US 2002/0167494 A1 Nov. 14, 2002

(51) Int. Cl.$^7$ .......................... G09G 5/00; H03K 17/94; H03M 11/00
(52) U.S. Cl. .......................... 345/168; 341/20; 341/21
(58) Field of Search .......................... 345/168; 341/20, 341/22; 307/116; 400/472; 200/600; 340/825.23

(56) References Cited

U.S. PATENT DOCUMENTS

| | | | |
|---|---|---|---|
| 3,786,497 A | | 1/1974 | Davis et al. ............. 340/365 S |
| 3,863,060 A | * | 1/1975 | Rode et al. ............. 708/134 |
| 4,100,606 A | | 7/1978 | Brantingham |
| 4,222,038 A | | 9/1980 | Magerl ............. 340/365 S |
| 4,667,181 A | | 5/1987 | Hastreiter ............. 340/365 S |
| 4,739,310 A | | 4/1988 | Yamamoto ............. 340/365 S |
| 4,857,684 A | * | 8/1989 | Gratke ............. 200/600 |
| 4,876,461 A | * | 10/1989 | Gratke ............. 307/116 |
| 4,920,342 A | * | 4/1990 | Gratke ............. 341/22 |
| 5,349,344 A | * | 9/1994 | Head ............. 340/825.23 |
| 5,668,544 A | | 9/1997 | Chang et al. |
| 5,748,114 A | | 5/1998 | Koehn ............. 341/22 |
| 5,805,085 A | | 9/1998 | Hsu et al. |
| 5,831,556 A | | 11/1998 | Niot |
| 5,877,709 A | | 3/1999 | Ala-Lehtimäki et al. ...... 341/26 |
| 6,266,049 B1 | | 7/2001 | Nakai |
| 6,331,850 B1 | * | 12/2001 | Olodort et al. ............. 345/168 |

* cited by examiner

*Primary Examiner*—Amare Mengistu
*Assistant Examiner*—Prabodh Dharia
(74) *Attorney, Agent, or Firm*—Banner & Witcoff, Ltd.

(57) ABSTRACT

In a conventional 8×17 drive line/sense line keyboard switch matrix, a one-to-one correspondence between keyboard key switches and drive line/sense line pairs, together with a sequential driving of the drive lines, permits discrimination between 8×17=136 keyboard keys with 25 I/O pins. In contrast, the present invention utilizes drive line/sense line combinations to discriminate between keyboard keys with fewer total drive and sense lines, thereby reducing the number of required IC pin connections. In addition to achieving a reduction in the number of required pin connections, particular drive line/sense line contact patterns (e.g., a 2/2 pattern), and an associated subtraction algorithm, allow for efficient layouts of the drive lines and sense lines on respective membrane switch layers, a reduction of detection errors arising from inadvertent illegal simultaneous key presses, and discrimination of "special" simultaneous key press conditions.

15 Claims, 10 Drawing Sheets

KEYBOARD KEY DISCRIMINATION EMPLOYING DRIVE LINE/SENSE LINE COMBINATIONS AND ACCOMODATING SIMULTANEOUS KEY PRESS CONDITIONS

TECHNICAL FIELD

The present invention relates generally to keypad or keyboard data input devices (collectively referred to herein as "keyboards") used with general purpose computers and in a wide variety of application specific electronic devices, e.g., appliances, tools, calculators, etc. The invention has particularly useful application in connection with keyboards, e.g., computer keyboards, employing printed membrane switch structures.

BACKGROUND OF THE INVENTION

To a large extent, the computer industry has settled on using a n×m matrix of sense lines/drive lines for carrying out keyboard key switch discrimination. Such a matrix provides a means for an integrated circuit (IC) micro-controller device to decode (n×m) keyboard keys, with (n+m) electrical interface pins. The micro-controller device sequentially drives a voltage on a plurality of drive lines of the matrix. Keyboard key depression will effect a closure of an associated switch creating an electrical connection between a particular drive line and one of a plurality of sense lines, with the result that the micro-controller device will detect this voltage on the sense line and determine therefrom a corresponding alphanumeric character or function.

Typically, a membrane switch structure is used to form the keyboard key switch matrix. Referring to FIG. 1, a conventional computer keyboard 1 may utilize a conventional membrane switch structure 3, as shown in FIG. 2, which is installed underneath a set of keyboard keys 5. Membrane switch structure 3 generally has three layers 7, 9 and 11. Outer layers 7 and 11 sandwich intermediate layer 9. The three layers are generally made out of a thin insulative sheet of polyester (e.g., Mylar™) or other insulative material. Outer layers 7 and 11 each have, on their respective opposing inside surfaces 13 and 15, switch circuit patterns (17 and 19, respectively) which may be printed (e.g., silk-screened).

Circuit patterns 17 and 19 are appropriately laid out to provide contact points and lines of conduction for each of keyboard keys 5, within a conventional key switch matrix. The circuit patterns may be printed with suitable conductive inks, e.g., a polymer-based conductive ink having silver and/or carbon particles in suspension. Typically, each keyboard key 21 is coupled to a resilient or spring loaded plunger 23 positioned to make contact with a backside of upper outer layer 7 of membrane switch structure 3. Depression of selected ones of keyboard keys 5 causes a corresponding plunger 23 to exert pressure on upper outer layer 7. The resulting pressure causes a portion of electrical circuit 17 (e.g., a sense line) printed on the inner face of layer 7 to come resiliently into electrical contact with a portion of circuit 19 (e.g., a drive line) printed on the inner face of bottom outer membrane layer 11. This contact occurs through contact apertures 24 (one shown) provided in intermediate layer 9. The electrical contact allows passage of a drive signal on a particular sense line for input to an IC micro-controller device. By recognizing the sense line on which the signal is generated, and the timing of the appearance of the generated signal on the sense line, the IC can discriminate which of keyboard keys 5 has been depressed. The micro-controller device, in turn, provides a digital output signal readable by an associated computer.

FIG. 3 schematically illustrates a conventional arrangement of a computer keyboard switch circuit matrix 25 electrically connected with an IC die package 27 (typically mounted within the keyboard housing). In the conventional arrangement, a total of 17 drive lines 29 extend from IC die package 27 to corresponding drive lines 31 of switch circuit matrix 25. Drive lines 31 are laid-out in intersecting relationship with a total of eight sense lines 33. As previously described, and shown in FIG. 2, the drive lines are typically arranged on a first outer layer of a membrane switch structure, and the sense lines are typically arranged on a second outer layer of a membrane switch structure. This conventional arrangement requires IC die package 27 to accommodate a total of twenty-five (8+17=25) pin connections 35 spaced about the periphery of die package 27, for the signal (drive and sense) lines alone. Additional pin connections (not shown) must also be provided, e.g., for $V_{cc}$, Gnd, Osc, HostData and HostClk.

A silicon chip 37 centrally located within die package 27 contains IC logic (including the micro-controller device) for carrying out keyboard key discrimination and related functions. The logic circuitry integrated onto chip 37 is small relative to the available surface area of chip 37 and the high levels of integration attainable with available photolithographic IC fabrication techniques. A much smaller chip (and hence less silicon) could be utilized if it were not for the fact that a certain minimum size of chip 37 is required in order to accommodate pin connections 39 about the periphery of chip 37. Also, the area of chip 37 is small relative to the overall size of die package 27, due to the relatively large space requirements for making the pin connections 35 on the outer periphery of die package 27, as well as pin connections 39 located around the periphery of chip 37. But for the space required to accommodate the large number of required pin connections, the size of die package 27 could be reduced considerably, thus reducing the printed circuit board space required within the keyboard for accommodating die package 27. In addition, a reduction in the number of pin connections would reduce the materials, and manufacturing costs associated with making, as well as testing, the pin connections.

Commonly assigned U.S. patent application Ser. No. 09/604,688, filed Jun. 27, 2000, discloses a system providing a considerable improvement over the conventional keyboard keyswitch matrix. In accordance with the invention therein described, keyboard key discrimination by time division multiplexing may be used to reduce the size of an integrated circuit (IC), and the overall size of an IC die package, by reducing the total number of pins required to interface with a keyboard key switch matrix. The system provides an arrangement whereby a given sense line can sense signals of more than one drive line for a valid key press duration (i.e., key actuation), and whereby a given drive line can drive more than one sense line for a given valid key press duration. In contrast with conventional methods, which use one-to-one correspondence between keyboard key and drive/sense line pairs, the inventive system of application Ser. No. 09/604,688 utilizes plural drive/sense line combinations to discriminate among keyboard keys in a time division multiplexed fashion. In this manner, the number of drive and sense lines required for key discrimination may be reduced, thereby substantially reducing the total number of IC pin connections required for a typical keyboard having, e.g., 131 keys.

SUMMARY OF THE INVENTION

The present invention builds on the advances disclosed in above-noted application Ser. No. 09/604,688. Key discrimination in accordance with the present invention can provide a reduction in potential occurrences of simultaneous key press detection errors and permit discrimination under "special" simultaneous key press conditions. In addition, a simple and efficient layout of the drive lines and sense lines on the membrane switch layers is facilitated.

In a first aspect, the invention provides a keyboard switch matrix for use in keyboard key discrimination. The matrix includes a plurality of drive lines, a plurality of sense lines and a plurality of switches for selectively causing contact between the drive lines and sense lines upon actuation of associated keyboard keys. A first set of the plurality of switches is arranged to bring into exclusive contact, upon actuation of an associated key, a first drive line with a first sense line and a second drive line with a second sense line.

In a second aspect, the invention is embodied in a keyboard switch circuit for providing key discrimination among a plurality of keyboard keys. The switch circuit includes a switch matrix comprising a plurality of drive lines, a plurality of sense lines and a plurality of switches for selectively causing contact between the drive lines and sense lines upon actuation of associated keyboard keys. A first set of the plurality of switches is arranged to bring into exclusive contact, upon actuation of an associated key, a first drive line with a first sense line and a second drive line with a second sense line. An integrated circuit (IC) is coupled to the plurality of drive lines and sense lines, and includes logic circuitry for sequentially driving signals on the plurality of drive lines in a cyclical manner. The IC senses the signals that appear on the plurality of sense lines and discriminates an actuated key based upon the sensed signals.

In a third aspect, the invention provides a method for keyboard key discrimination. Signals are sequentially driven on a plurality of drive lines in a cyclical manner. Signals that appear on the plurality of sense lines as a result of a first drive line coming into exclusive contact with a first sense line and a second drive line coming into exclusive contact with a second sense line are sensed. An actuated key is discriminated based upon the signals.

The above and other features and advantages of the present invention will be readily apparent and fully understood from the following detailed description of preferred embodiments, taken in connection with the appended drawings.

DETAILED DESCRIPTION OF THE PREFERRED EMBODIMENTS

Figure 1:
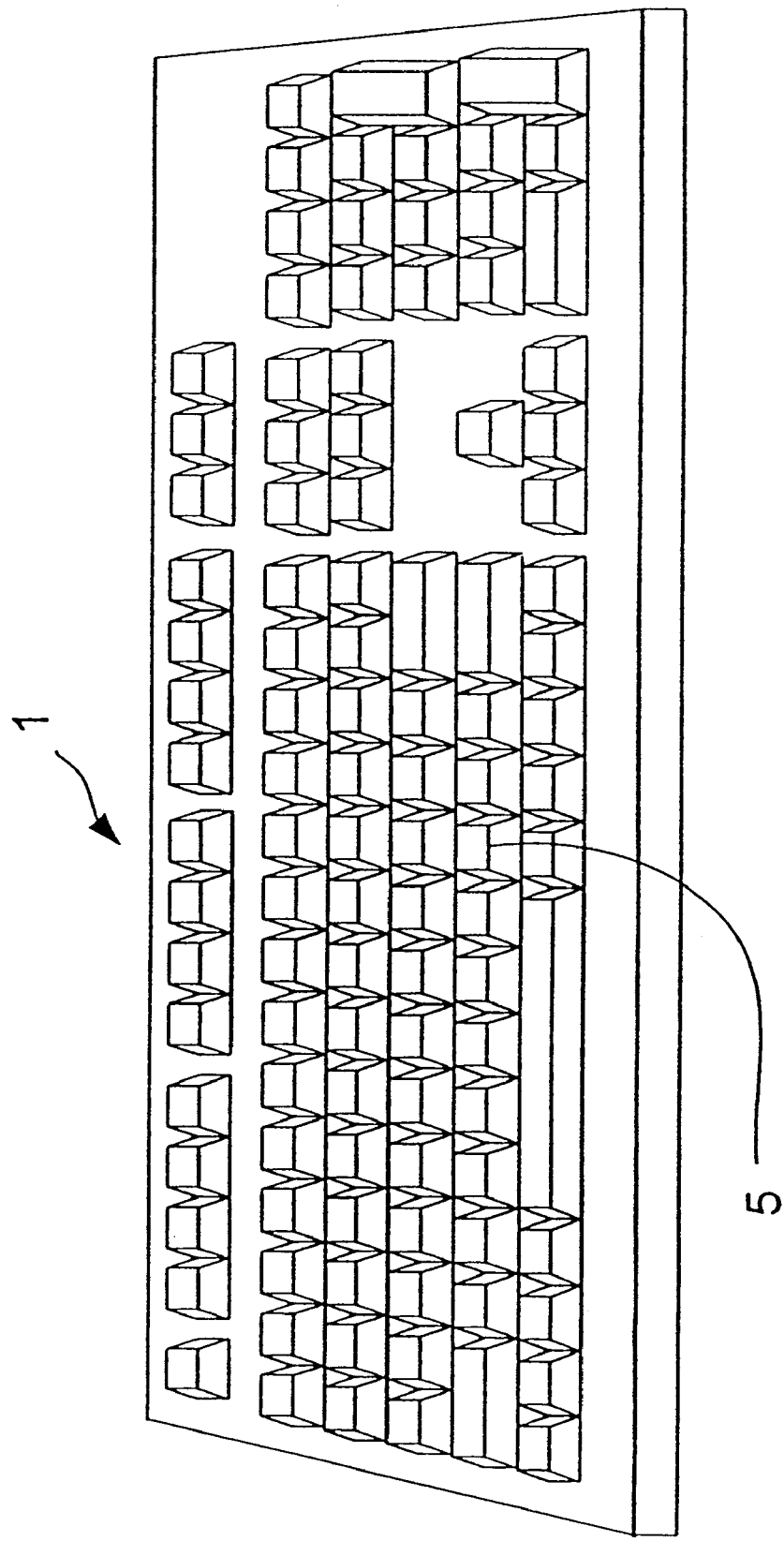
FIG. 1 is a perspective view of a conventional computer keyboard.
Figure 2:
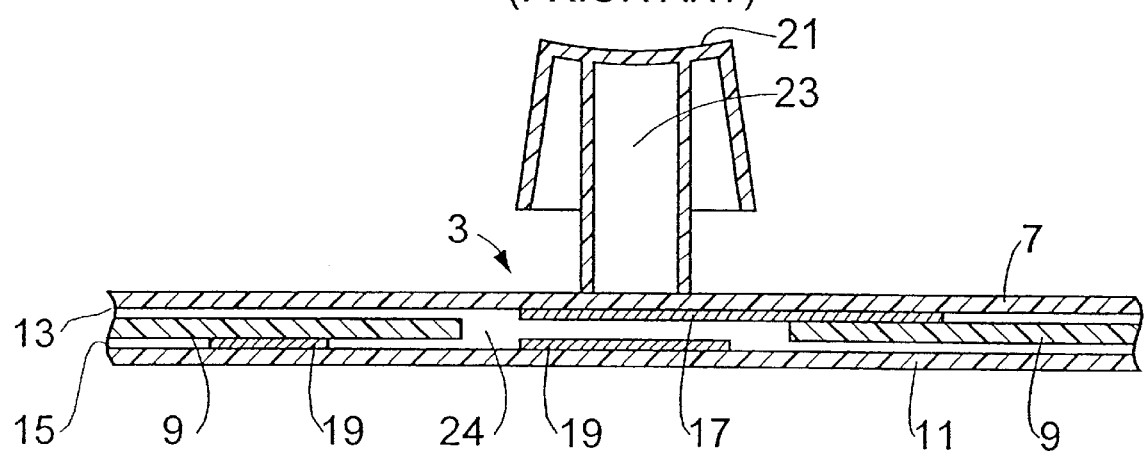
FIG. 2 is a cross-sectional view of a conventional three layer membrane switch structure, and associated keyboard key.
Figure 3:
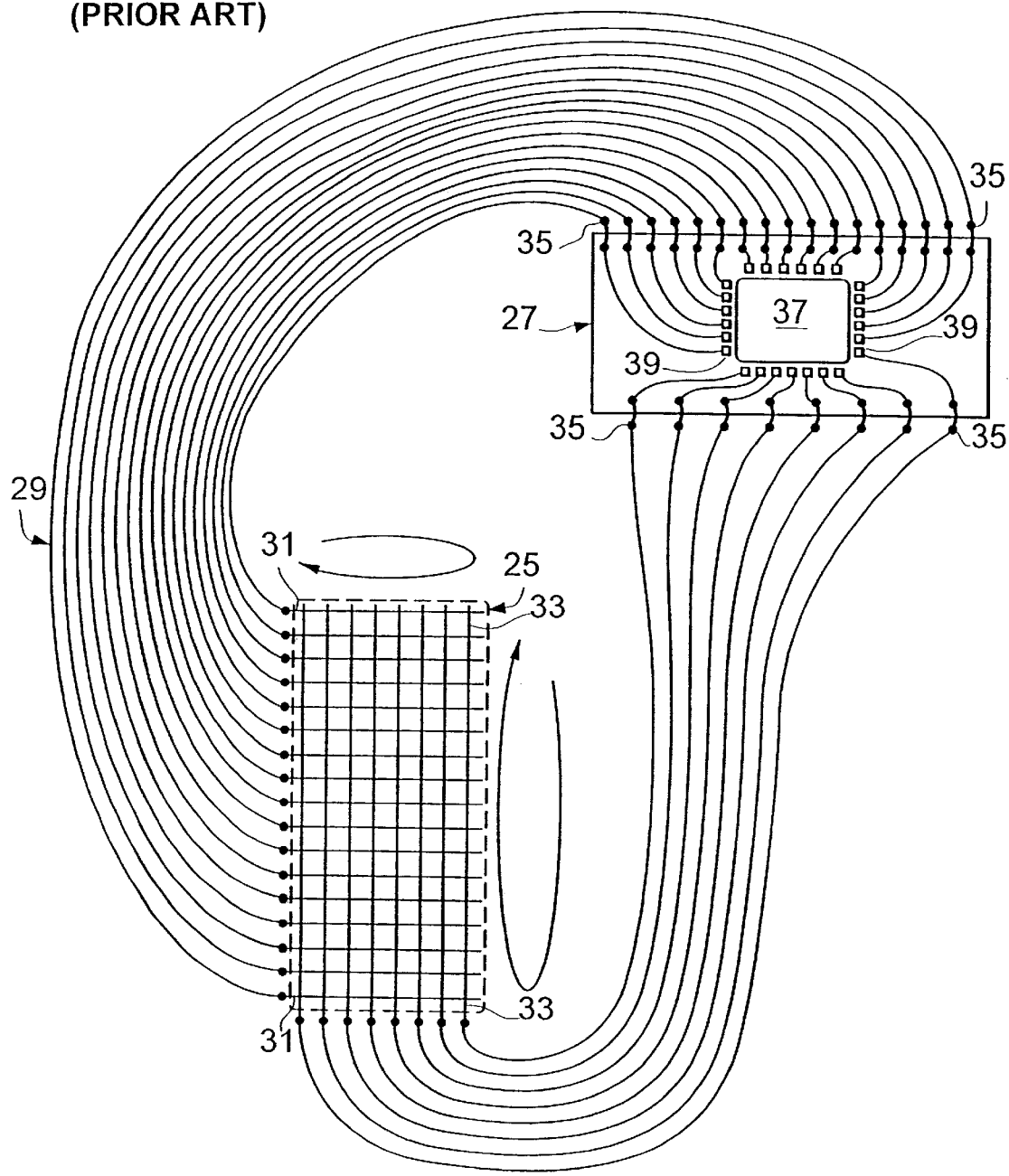
FIG. 3 is a schematic depiction of a conventional arrangement of a keyboard key switch circuit matrix in electrical connection with an IC die package.

Building on the advances disclosed in application Ser. No. 09/604,688 (which is hereby incorporated by reference in its entirety), the present invention contemplates a "2/2 Solution" for utilizing drive line/sense line combinations to increase key discrimination capacity (for a given number of pin connections). This approach is well suited for implementation in computer keyboards, wherein (1) functionalities are provided by certain "special" simultaneous key press conditions (e.g., use of modifier keys); (2) inadvertent illegal simultaneous key press conditions are likely to arise; and (3) a large number of keys dictates simplicity and efficiency in the layout of the conductive drive line/sense line traces on the membrane switch layers.

Overview of the Matrix Layout

Based on an arrangement of multiple drive line/sense line contact points for each key, the 2/2 matrix layout includes:

Component 1:

a single drive line that contacts a single sense line in the event of a key press; and Component 2:

a second drive line, different from the drive line of Component 1, that contacts a second sense line, different from and preferably adjacent to the sense line of Component 1, in the event of a key press.

These contacts occur directly under the keycap, preferably for all regular (non-modifier) keys. An exemplary organization of a computer keyboard keyswitch matrix employing the 2/2 Solution is indicated below:

1. Six drive lines;
2. Six sense lines; and
3. Two special drive lines that use a standard (single) drive line/sense line pair of contacts for modifier keys.

For this arrangement, a total of 14 input/output pins are used on the microprocessor for the switch matrix, allowing the connection of up to 180 non-modifier keys and 12 modifier keys. This is in contrast to a standard single drive/sense line pair arrangement which, using 25 pins, would have a maximum of 156 keys.

Overview of the Key Discrimination Logic

The matrix is scanned in a conventional manner. (Scanning can occur more quickly, however, since there are only six drive lines instead of the conventional seventeen.) Typically, this involves setting each of the drive lines to a logical low level, individually and momentarily, in a sequential manner. At each time that a drive line is driven to a logical low state, the logic levels of the sense lines are inputted to a microprocessor (which may be keyboard mounted) via input pins. This inputted data contains a unique pattern. When no keys are pressed, all of the data read into the microprocessor from the sense lines will contain logical highs. When a key is pressed, this will cause a unique pattern of two low bits to be read from the six sense lines by the microprocessor. The bit position of the two logical low signals will correspond with the two drive/sense line pairs contacted by the keys. If there are six drive lines and six sense lines, then there will be six data reads (one for each drive line), each containing six bits (one for each sense line). The pattern of the two bits that are low in associated registers provide the necessary information to determine which key was pressed. By identifying the low bits, the correct key code can be obtained and then transmitted to the associated computer.

Identification of the bits read in, i.e., the Scan Words, is preferably performed by microprocessor firmware employing a simple look-up. A subtraction algorithm is employed to handle inadvertent multiple key press conditions, e.g., to distinguish between keys that are just being pressed and keys that are being released. In the subtraction algorithm, the last (Old) state of the switch circuit matrix is saved and compared with the new (just read) state. These states are compared using conventional digital logic to subtract out the relevant information which is needed to detect the keys. The firmware is preferably equipped to handle all states likely to be encountered by the matrix, and to assure that certain combinations of keys (special simultaneous key press conditions) can be detected.

An Example

The 2/2 Solution is now described in greater detail by way of a specific example, wherein the key switch circuit matrix includes:

six sense lines (1, 2, 3, 4, 5, 6);
six regular drive lines (A, B, C, D, E, F) connectible in pairs at regular key points to respective pairs of the six sense lines; and
two special drive lines (G, H), each connectible to single sense lines at special key points.

Figure 4:
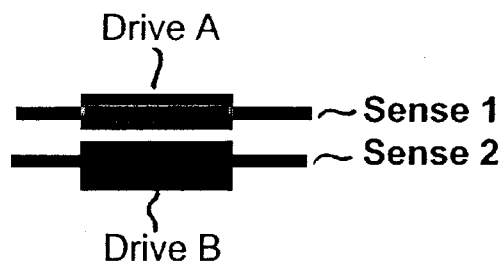
FIG. 4 is a diagrammatic plan view of overlaid drive line/sense line contacts of a keyswitch in a "2/2 Solution" according to a present invention.
Figure 5:
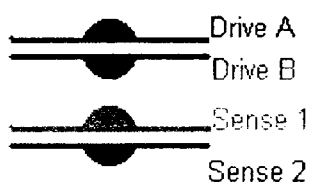
FIG. 5 is a diagrammatic plan view illustrating an exemplary configuration of drive line/sense line traces and contacts in accordance with the 2/2 Solution.

For drive lines A–F, the contacts effected by a key press are as follows. One drive line is contacted with one sense line, and a second separate drive line is connected with a second, preferably adjacent, sense line. This arrangement is illustrated in FIG. 4, for drive lines A and B. As can be seen, the contact pattern formed on the upper and lower membrane switch layers can be of straightforward design. Contacts of drive lines A and B can be overlaid sense lines 1 and 2. The contact pattern as shown would yield, on depression of an associated key, the key code A1–B2. As shown in FIG. 5, drive lines (provided on a first membrane switch layer) and sense lines (provided on a second membrane switch layer) can be run in parallel pairs and provided with opposed contact pads. Designers may use rectangular, semicircular or even interdigitated pads, depending on mechanical and ESD requirements.

The sense lines are preferably contacted in an adjacent fashion such that none are "skipped." Thus, the sense line combinations are preferably 1-2, 2-3, 3-4, 4-5 and 5-6. This continuity is desirable to achieve simplicity in routing of the conductive traces of the key switch circuit patterns (drive lines and sense lines). Preferably, all six sense lines are routed in a continuous fashion so that there is no starting or stopping of the conductive traces on the membrane switch layers. (Skipping sense lines in key drive/sense line pair assignments would require starting and stopping the traces, which would substantially complicate the routing of the traces.) In addition, this design rule facilitates effective implementation of a subtraction algorithm (described below) for handling inadvertent multiple key press conditions. From the indicated sets, the following five drive line/sense line combinations (five unique key codes) are obtained.

| Drive line "A" | Drive line "B" |
|---|---|
| 1 | 2 |
| 2 | 3 |
| 3 | 4 |
| 4 | 5 |
| 5 | 6 |

An additional five codes can be obtained by interchanging the positioning of drive lines A and B. Thus, any pair of drive lines can generate the following ten unique key codes:

| | |
|---|---|
| A1-B2 | B1-A2 |
| A2-B3 | B2-A3 |
| A3-B4 | B3-A4 |
| A4-B5 | B4-A5 |
| A5-B6 | B5-A6 |

From the set of drive lines (A–F), the following fifteen drive line pairs can be generated:

| |
|---|
| A-B |
| A-C |
| A-D |
| A-E |
| A-F |
| B-C |
| B-D |
| B-E |
| B-F |
| C-D |
| C-E |
| C-F |
| D-E |

-continued

D-F
E-F

Since each of these fifteen unique pairs can generate ten key codes, the total possible number of keys that can be generated by this system is 15×10=150.

Method of Detection of Regular Keys

The following method may be used to detect (discriminate) keys. Each of the drive lines (A–F) may be signaled low individually in a known sequential manner. After each of these lines reaches a low state, the six sense lines will be read as microprocessor input. For each drive line, six bits of data (a bit corresponding to each sense line) will be stored in an appropriate temporary register. Once the six drive lines have been signaled, and each of the sense lines has inputted its state, six temporary registers will contain six bits of significant data. For each non-modifier key that is pressed, two bits will be 0—each occurring in a different register. If a single, non-modifier key is pressed, this will result in the following six reads: two six bit register reads with one 0 and five 1 bits; and four six bit register reads with six 1 bits. A total of 36 bits of data is read in, collectively referred to as the "Scan Word."
Example Scan Word:

| A1-6 | B1-6 | C1-6 | D1-6 | E1-6 | F1-6 |
|---|---|---|---|---|---|
| 011111 | 101111 | 111111 | 111111 | 111111 | 111111 |
| This translates to A1-B2. | | | | | |
| 111111 | 111111 | 111101 | 111110 | 111111 | 111111 |
| This translates to C5-D6. | | | | | |

So long as only two 0 bits appear in the predetermined sequences, then only one key is pressed and its identity can be uniquely determined by the Scan Word. If, however, more than two 0 bits are found, a subtraction algorithm (described below) is preferably implemented in order to either uniquely determine which keys are pressed or to (optionally) signal to the host computer that the state of the matrix is indeterminate. Once the key or keys have been uniquely identified, the resulting key code(s) is (are) then translated to code(s) readable by the host computer using a look-up table, and then used to update a buffer for transmission to the host computer.

Special Key Press Conditions

Microsoft's Windows Hardware Quality Labs (WHQL) specifications define a set of up to eight modifier keys that, if present, must be are uniquely detectable when depressed in pairs, and when depressed together, individually or in certain pairs, with a key from a set of keys called the Valid Final Keys. WHQL defines keys as one of three types: modifier keys, Valid Final Keys, and regular keys (i.e., keys which are neither modifier keys nor Valid Final Keys). The Valid Final Keys are a set of keys that must be uniquely detectable while any one modifier key or specific combinations of two modifier keys are concurrently pressed. For example, in the case of Ctrl-Shift-Enter, for example, Enter is a Final Key, and Ctrl-Shift is an allowed combination of two Modifier Keys. To allow for discrimination of the eight modifier keys (depressed with another other modifier key and/or a Valid Final Key), a separate matrix configuration may be designed as follows.

Two additional Drive lines (G, H) may form a single contact point with a single sense line under respective modifier keys. The contact pattern for the modifier keys may thus be of the same type conventionally used in keyboard keyswitch matrices. The drive lines may be connected to each of sense lines 1–6. Thus, the following are possible key codes (only eight of these twelve possibilities are needed to meet WHQL specification):

| | |
|---|---|
| G1 | H1 |
| G2 | H2 |
| G3 | H3 |
| G4 | H4 |
| G5 | H5 |
| G6 | H6 |

Figure 6:
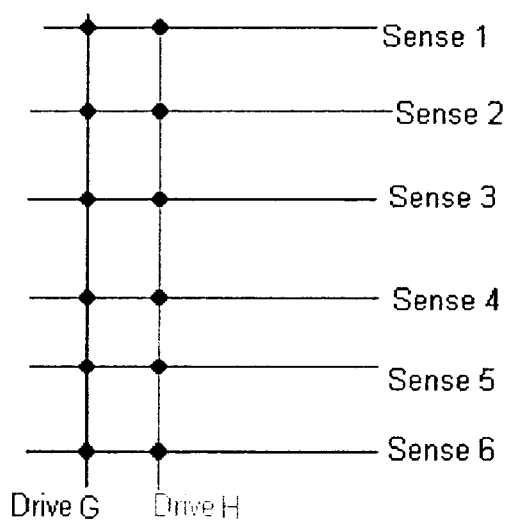
FIG. 6 is a schematic depiction of a keyswitch matrix utilized for discrimination of a set of "special" keys of a computer keyboard, for use in conjunction with the 2/2 Solution.

FIG. 6 illustrates the above-described matrix layout. This layout allows for any two modifier keys to be detected at one time, and will provide a standard ghosting (a.k.a. phantom) signal when three keys are pressed to form an L-shaped conduction pattern. Such a ghosting condition does not adversely affect WHQL functionality, since only two of the special keys are required to be correctly detected at once.

Figure 7:
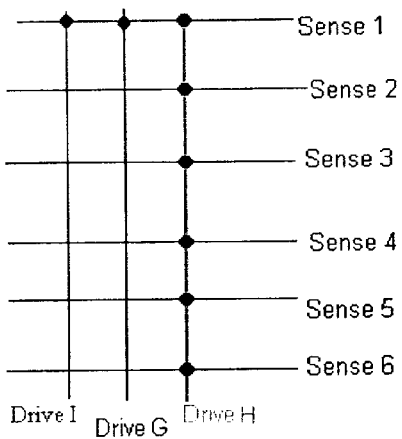
FIG. 7 is a schematic depiction of an alternative keyswitch matrix for discrimination of "special" keys for use in conjunction with the 2/2 Solution.
Figure 8:
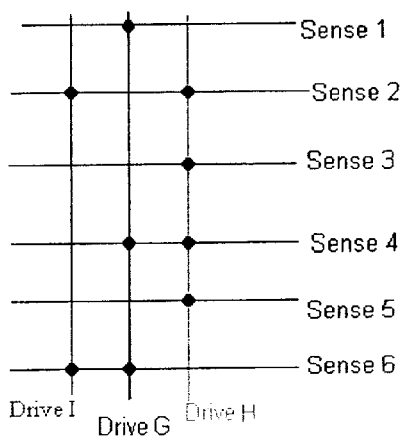
FIG. 8 is a schematic depiction of another alternative keyswitch matrix for discrimination of "special" keys for use in conjunction with the 2/2 Solution.

With the addition of a third drive line, I, the modifier keys may be arranged, as shown in FIG. 7, so that an indeterminate ghost condition cannot occur. This is an eight key pattern. FIG. 8 shows a nine key pattern which similarly will avoid an indeterminate ghosting condition upon depression of three modifier keys simultaneously. Technically, a ghost can occur, but it will always involve one position in the matrix where a switch does not exist, thus permitting the firmware to make a proper identification by elimination.

Method of Detection of Modifier Keys

As with drive lines A–F, the two drive lines G, H will be driven low individually and the sense lines will be read for each drive line. The data will be read into temporary registers, as previously described. Given the conventional single drive line/sense line pair contacts of the key switch matrix for the modifier keys, the translation to key scan code involves a simple look-up in a table to find the key corresponding to the bits contained in the temporary registers. A ghost detection check can be implemented here to avoid errors caused by inadvertent simultaneous depression of three modifier keys. An example (only eight of twelve possible bits needed for WHQL compliance):

| G1-6 | H1-2 |
|---|---|
| 110111 | 101111 |

The above data indicates that G3 and H2 are down.

Conductive Trace Routings

Figure 11A:
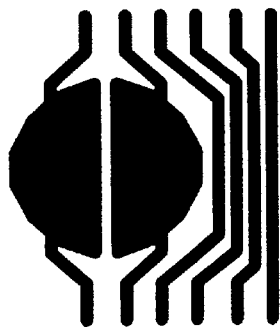
FIGS. 11A–11C are close-up views of symbols for regular (non-modifier) keys used in generating a sense line layout as shown in FIG. 11.
Figure 11B:
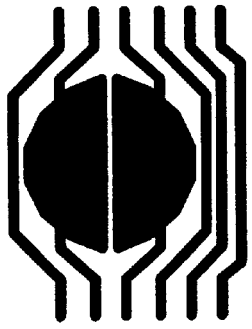
Figure 11C:
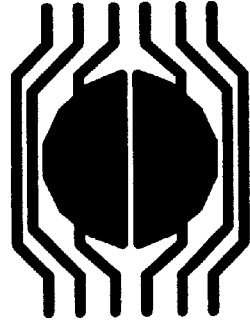
Figure 11D:
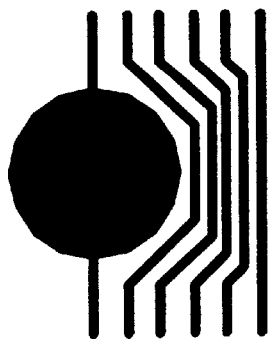
FIGS. 11D–11F are close-up views of symbols for modifier keys used in generating a sense line layout as shown in FIG. 11.
Figure 11E:
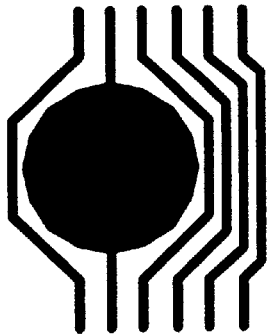
Figure 11F:
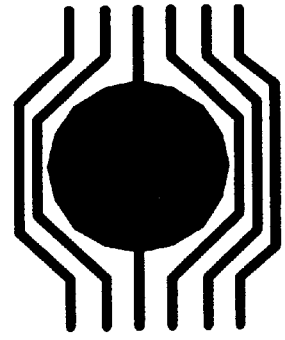

The routing of the conductive traces for the modifier keys may follow conventional methods and can be implemented accordingly. With regard to the regular keyswitch matrix, the six sense lines on the bottom (or top) membrane switch layer can advantageously be routed as substantially parallel adjacent lines extending in a serpentine manner across the associated membrane switch layer. The drive line trace routings can also be made fairly simple. For the case where six sense lines are provided, adjacent drive lines can be paired off to create respective groups of ten keys. If this group of keys is selected such that the keys within a group are normally depressed by a given finger, it is less likely that 2-key combinations involving common drive lines will arise. Another advantage of this layout relates to ghost key symbols as shown respectively in FIGS. 11D–11F may be used, rotated as necessary.

Exemplary key code tables, corresponding to the circuit layouts shown in FIGS. 10–11, appear below in Tables 1 and 2.

TABLE 1

|    | AB        | AC | AD | AE    | AF | BC | BD | BE       | BF        | CD | CE         | CF          | DE | DF        | EF  |
|----|-----------|----|----|-------|----|----|----|----------|-----------|----|------------|-------------|----|-----------|-----|
| 12 | Escape    | F1 | F3 | Space | F6 |    |    |          | Numpad 0  |    | Numpad Enter | Scroll Lock |    | F11       | F8  |
| 21 |           | F2 | F4 | F5    | F7 |    |    | Numpad . | Pause     |    |            | Print Screen |   | F10       | F9  |
| 23 | `         | ~  | 2  | 4     | 6  |    |    | 8        | Numpad /  | Num Lock |      | Numpad –    | Home |    | Backspace | 0   |
| 32 | 1         | 3  | 5  | 7     | 9  |    |    |          | Numpad *  | Page Up |       |             | Insert |  | =         | –   |
| 34 | Tab       | W  | R  | Y     | I  |    |    |          | Numpad 8  | Numpad 7 |      |             | End    |  | \         | P   |
| 43 | Q         | E  | T  | U     | O  |    |    |          | Numpad 9  | Page Down |     |             | Delete |  | ]         | [   |
| 45 | Caps Lock | S  | F  | H     | K  |    |    |          | Numpad 5  | Numpad 4 |      | Numpad +    | Up Arrow | | F12       | ;   |
| 54 | A         | D  | G  | J     | L  |    |    |          | Numpad 6  |          |      |             |        |  | Enter     | '   |
| 56 |           | X  | V  | N     | ,  |    |    |          | Numpad 2  | Numpad 1 |      |             | Down Arrow | |           | /   |
| 65 |           | Z  | C  | B     | M  |    |    | .        | Numpad 3  | Right Arrow |   |             | Left Arrow |  |           | App | rejection. As will be described, with the subtraction algorithm of the present invention, it may be possible to have a "best guess" when more than one non-modifier key is pressed, based on whether or not one of two candidates is usually typed by the same finger as is the known key. In this respect, if it is known that all keys shared by a given finger share the same drive lines, it is a simple matter for firmware to determine if two keys share a finger, and to deduce that it is not likely that those two keys are pressed at the same time.

Figure 9:
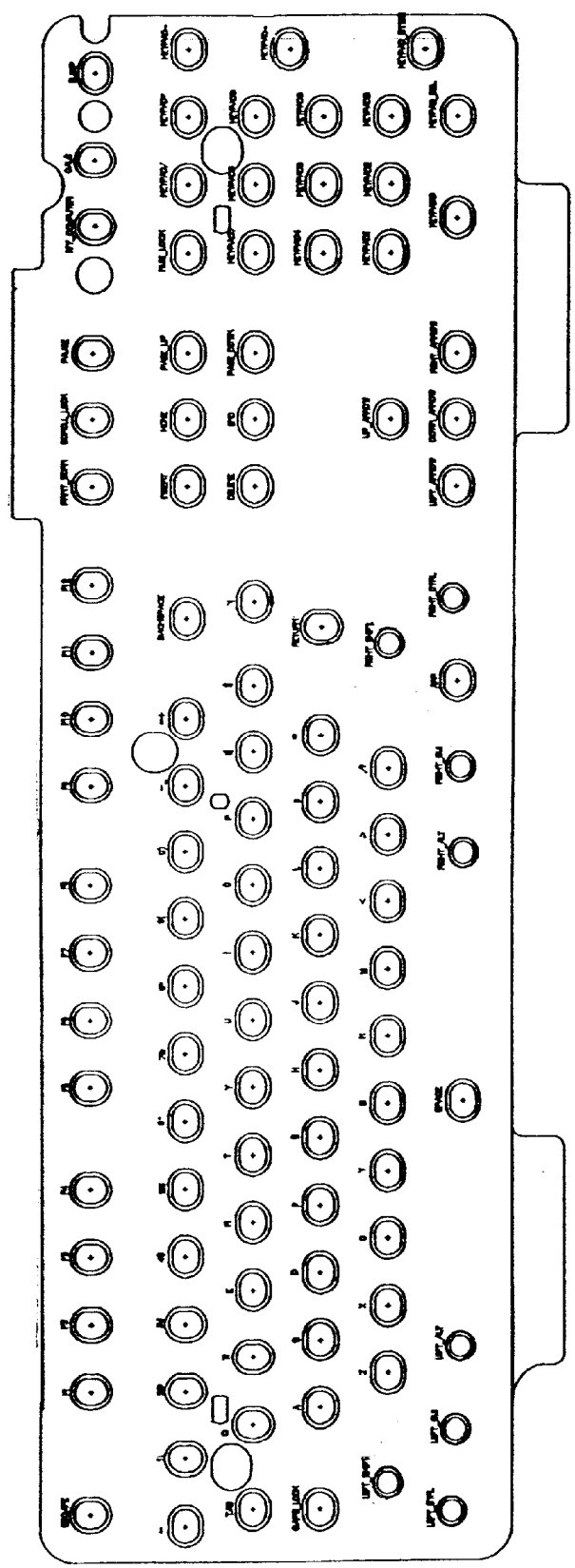
FIG. 9 is a diagrammatic plan view of a full size computer keyboard to which the 2/2 Solution may be applied.

FIG. 9 illustrates the key layout of a standard 104 key keyboard. Exemplary key switch circuit pattern layouts for the drive lines and sense lines (upper and lower membrane switch layers) generally applicable to the key layout of FIG. 9, are shown, respectively, in FIGS. 10 and 11. The illustrated circuit pattern layouts are diagrammatic. An actual production layout would likely differ in respects that one of ordinary skill in the art will readily appreciate, e.g., taking into account spatial considerations such as the actual positions of the keys, line widths and drawing rules for manufacturing, and the inclusion of "keep-out" areas for physical case supports, screw holes, etc.

Figure 10:
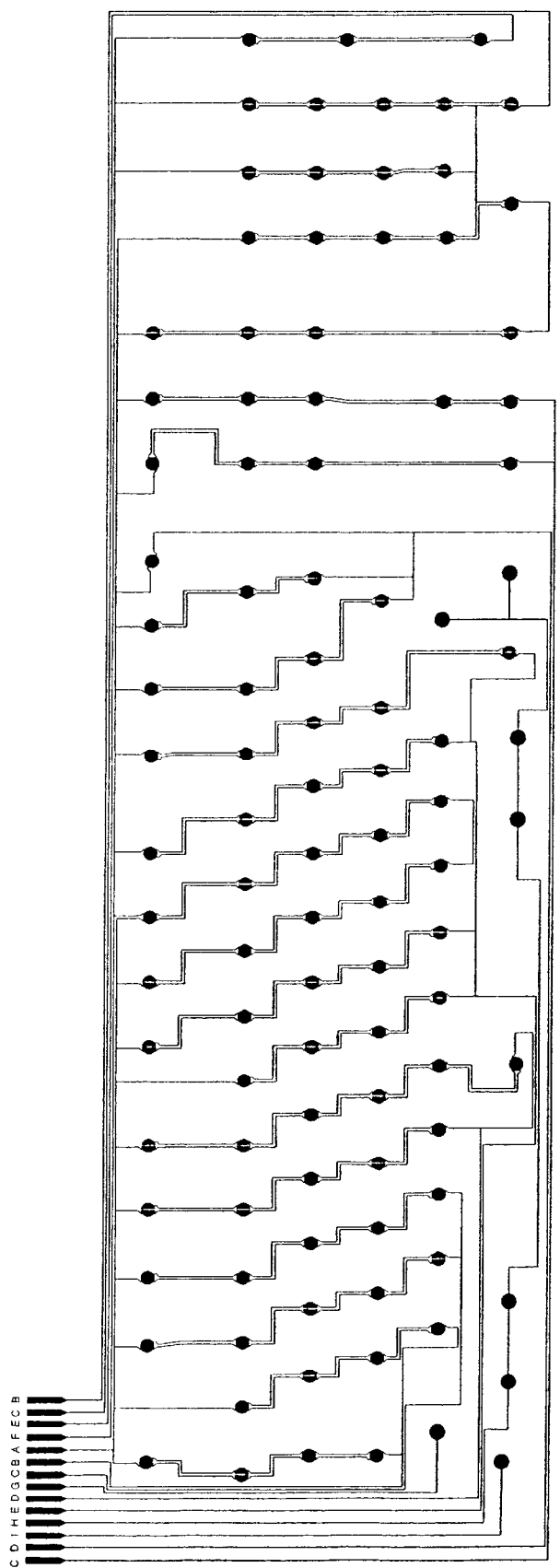
FIG. 10 is an exemplary layout of drive lines in accordance with the 2/2 Solution, for application to a keyboard layout as shown in FIG. 9.
Figure 10A:
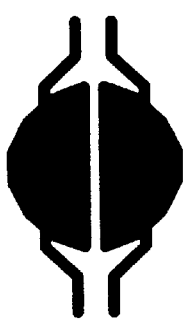
FIG. 10A is a close-up view of a symbol for regular (non-modifier) keys usable in generating a drive line layout as shown in FIG. 10.
Figure 10B:
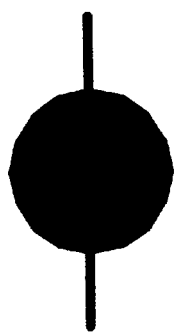
FIG. 10B is a close-up view of a symbol for modifier keys used in generating a drive line layout as shown in FIG. 10.

FIG. 10 shows traces for drive lines A–I that may be placed on the upper (or lower) layer of the membrane switch structure. Drive lines A–I are laid out in adjacent interdigitated pairs, to obtain the Scan Word pattern desired for regular key drive lines A–F. Drive lines G–I, for the modifier keys, are laid out individually. Advantageously, the artwork for the drive line layout of FIG. 10 may be generated with only two symbols which can be easily entered into a symbol library and then copied to the various key locations. FIG. 10A shows, close-up, the symbol used for the regular (non-modifier) keys. FIG. 10B shows, close-up, the symbol used for the modifier keys.

Figure 11:
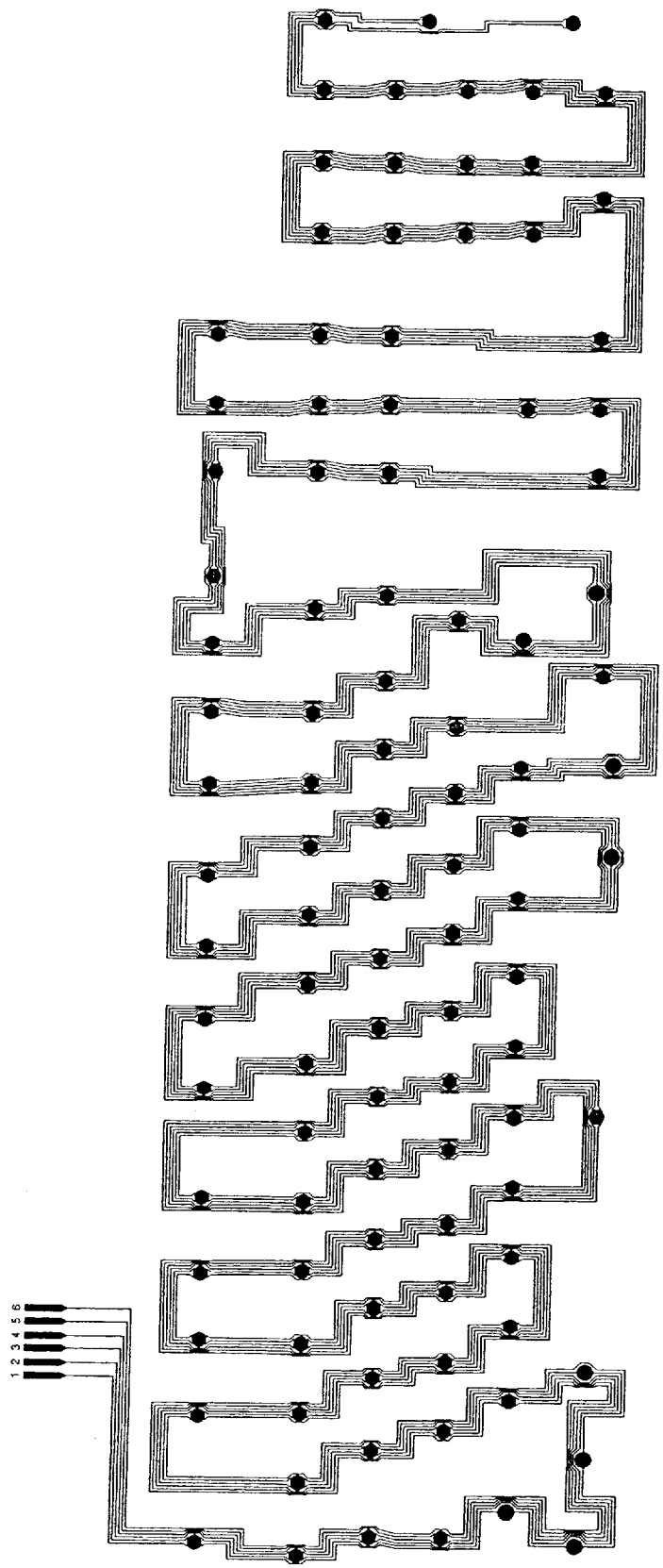
FIG. 11 is an exemplary layout of sense lines in accordance with the 2/2 Solution, for application to a keyboard layout as shown in FIG. 9.

The layout of FIG. 11 shows traces for sense lines 1–5 that may be formed on the lower (or upper) layer of the membrane switch structure. These trace lines are snaked across the substrate sheet in a serpentine manner to provide complete coverage of the keyboard. Advantageously, with the illustrated layout, all five sense lines are available at any key location. Such a layout is robust and especially helpful in selecting key codes that minimize ghosting. The artwork of the sense line layer shown in FIG. 11 may be formed with a total of six different symbols. For the non-modifier keys, three symbols, shown respectively in FIGS. 11A–11C, may be used, rotated as necessary. For the modifier keys, three

TABLE 2

|   | G          | H             | I            |
|---|------------|---------------|--------------|
| 1 | Left Shift | Left GUI      | Left Control |
| 2 |            | Left Alt      |              |
| 3 |            | Right Alt     |              |
| 4 |            | Right GUI     |              |
| 5 |            | Right Control |              |
| 6 |            | Right Shift   |              |

Table 1 shows how each adjacent pairing of drive lines A–F provides, with sense lines 1–6, a group of 10 regular keys. Table 2 shows a group of eight exemplary modifier keys provided by a standard matrix of sense lines 1–6 with additional drive lines G–I.

Figure 12:
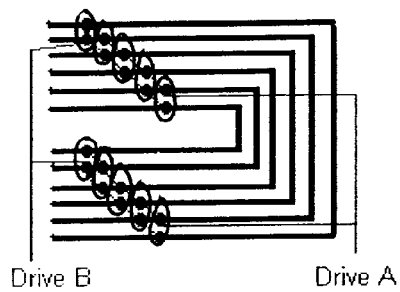
FIG. 12 is a schematic depiction of conductive tracings of a pair of drive lines overlayed with six sense lines to create contact patterns in accordance with the 2/2 Solution.

FIG. 12 shows, in principle, how the conductive tracings of a pair of interdigitated drive lines A, B (e.g., as shown in FIG. 10) may be overlayed with sense six lines (1–6) laid out in a serpentine manner (e.g., as shown in FIG. 11) to create contact patterns of the drive lines and sense lines permitting discrimination of ten keys. It can be seen that a key can be discriminated for every combination of two drive lines contacting two respective sense lines (a "2/2" pattern). With a total of six sense lines, ten keys can be discriminated for each pair of drive lines that is provided.

Inadvertent Simultaneous Key Press Conditions/The Subtraction Algorithm

In accordance with the 2/2 Solution, key discrimination can be carried out notwithstanding certain inadvertent (unintentional) simultaneous key press conditions, through use of subtraction algorithm techniques as described below.

The principle of the inventive subtraction technique arises from the inventors' recognition that two pressed keys will form a pattern that can be deciphered if the key code for the "first key" pressed is known. By taking the unknown two key state and subtracting the initial one key state, the key code for the second key can be obtained. Subtraction is then, basically, the process of reading in a new status of the keyboard and comparing it to an old status to detect any new key presses or releases. In general, the subtraction algorithm should (1) be able to detect any likely combination of two keys pressed, given the history of the system; and (2) be able to determine when it cannot perform function (1) and return that the system is indeterminate. The algorithm may return ambiguous results if more than two keys are pressed.

If more than one key is pressed, then more than 2 bits in the Scan Word will be 0. The effective value of the Scan Word will be the logical AND of the Scan Words representing the individual keys.

For example, if A1C2 and B2F3 are both pressed then the Scan Word will appear as:

| A | B | C | D | E | F |
|---|---|---|---|---|---|
| 011111 | 101111 | 101111 | 111111 | 111111 | 110111 |

In this example, four bits are 0: A1, B2, C2 and F3. The Scan Word could alternatively be expressed as A1B2C2F3.

If more than four bits are 0, then more than two keys are pressed, and the Subtraction Algorithm can reject this condition as indeterminate even though specific cases may actually be determinate.

Therefore, the Subtraction Algorithm may consider only those Scan Words with three or four 0 bits, as less than three are determinate, and more than four are indeterminate. Furthermore, the Subtraction Algorithm need only consider permutations of exactly two keys that might cause those three- or four-0-bit Scan Words as it is not required to correctly determine combinations of more than two keys.

One simplifying assumption is that, if the Scan Word contains more than two bits, and the previous Scan Word was determinate, then a key in the previous Scan Word, if any, is still pressed, rather than the alternative that it was released and two different keys pressed. Another simplifying assumption is that the designer followed the recommendation that sense lines be logically adjacent in any given key.

If the subtraction algorithm succeeds, it will return two keys pressed. If those keys are illegal, for example, if a key does not have adjacent sense lines, then subsequent conversion to a PS2 Scan Code or a USB Usage will fail and the system can be called indeterminate at that point.

Three 0 Bits:

If three 0 bits appear in the Scan Word, then the two keys are sharing the sense line/drive line pair that contains the sense line that is adjacent the other two sense lines. The system is determinate because each key shares a drive line/sense line pair 0 bit, and the drive line/sense line pairs represented by the other two 0 bits are not shared.

An example of three 0 bits not sharing a drive line is A1, B2, C3. In this case the only allowed permutation is:

A1−B2+B2−C3

An example of three 0 bits sharing a drive line is A1, B2, A3. In this case, the only allowed permutation is:

A1−B2+B2−A3

Four 0 Bits:

Determination of two-key combinations wherein four 0 bits appear in the Scan Word depends upon how many sense lines and drive lines are shared by those two keys. Any two keys may share zero, one or two adjacent sense lines and/or may share zero, one or two drive lines.

If the previous state of the system was determinate, then zero, one or two keys were pressed previously. With four 0 bits down, the Subtraction Algorithm should first attempt to OR in, separately, each of the previously pressed keys, if any. If the result of the OR operation with each of those keys contains a valid 2-bit Scan Word, then, according to one of the simplifying assumptions above, firmware can deduce that the new key represented by those two bits is being pressed along with the previously pressed key whose OR operation isolated those two 0 bits. If no previously pressed key produces a valid two-0-bit Scan Word when the OR operation is performed, then the following cases come into play.

Four 0 Bits Not Sharing a Sense Line

In this case, the system is determinate, as the key with the lowest numbered sense line must have as its other 0 bit the drive line/sense line pair having next highest sense line, leaving the other two 0 bits as the second key's bits.

Four 0 Bits With One Sense Line Shared Between Three Drive Lines

If the four 0 bits share one sense line between three drive lines, then one drive line/sense line pair is shared among three switches and the system is determinate. For example, the Scan Word A1B1C1D2 is produced by A1−D2+B1−D2+C1−D2. However, the algorithm is allowed to return an indeterminate result since more than three keys are pressed. If desired, the firmware may be designed to properly report and track this condition.

Four 0 Bits With One or Two Sense Lines Shared Between Two Drive Lines

If the four 0 bits share one or two sense lines between two drive lines, then the system is indeterminate. For example,
Sharing One Sense Line Between Two Drive Lines:
(A1−B2+C2−D3) or (A1−C2+B2−D3) are both possible with Scan Word A1B2C2D3.
Sharing Two Sense Lines Between Two Drive Lines:
(A1−B2+C2−D1) or (A1−C2+B2−D1) are both possible with Scan Word A1B2C2D1.

Conclusion for Four 0 Bits

If four 0 bits are in the Scan Word and an OR operation with any previously pressed key isolates a valid two-0-bit Scan Word, then the new state of the system contains the previously pressed key and the new key produced by the OR operation. If the OR operation with each previously-pressed key fails to isolate a valid two-0-bit Scan Word, and the Scan Word is sharing neither sense lines nor drive lines, then the two keys are determined by pairing the two 0 bits having the lowest sense line numbers together in a key, and the remaining 0 bits together for the other key. All other cases of four 0 bits in the Scan Word are indeterminate.

There are several general cases that can be handled by a subtraction algorithm in accordance with the invention.
Case 1: A new key is pressed.

When a new key is pressed, the subtraction algorithm must identify which bits have changed since the last sample. When these bits are identified, they can be translated into the corresponding key code for the event which occurred between the samples.

The comparison is carried out by first XORing the Old and New states of the keyboard. The result of the XOR is then ANDed with the Old state of the keyboard. The result of this AND determines the next step. If there are exactly two "1" bits in the result, then the most likely event is that a key shares no signals with the old key and can be directly translated to the corresponding key code, and the appropriate "make" signals can be sent. If only one bit is set, then the algorithm must proceed to the Case 3 handler (see below) that will be used to determine the key code for the make signal. If no bits are set, then no new keys have been pressed. If more than two bits are set, then more than one key has been pressed and/or bridging has occurred, and the keyboard will transition to a Ghost state.

Example—overlapping key press/step-wise initiation:

Key α—A1–B2 is already down.

Key β—C3–D4 is just being pressed (while key α remains down).

|  | A | B | C | D |  |
|---|---|---|---|---|---|
| Old | 01111 | 10111 | 11111 | 11111 | α down |
| New | 01111 | 10111 | 11011 | 11101 | α and β down |
| XOR | 00000 | 00000 | 00100 | 00010 |  |
| AND(XOR, OLD) | 00000 | 00000 | 00100 | 00010 | Result |

The result can be used to discriminate C3–D4 (the β key).

Example—bridging:

Key α—A1–B2 is already down.

Key β—B1–C2 is just being pressed (while α key remains down).

|  | A | B | C | D |  |
|---|---|---|---|---|---|
| Old | 01111 | 10111 | 11111 | 11111 | α down |
| New | 00111 | 00111 | 00111 | 11111 | α and β down |
| XOR | 01000 | 10000 | 11000 | 00000 |  |
| AND(XOR, OLD) | 01000 | 10000 | 11000 | 00000 | Result |

The result is A2–B1–C1–C2, which does not properly translate into a key. Since there are more than two bits set, discrimination processing should transition to the Ghost state.

Case 2: A down key is released.

When a key is released, the subtraction algorithm should identify which bits have gone from the low to the high state. This bit identification is obtained by comparing the old and new states of the keyboard to see which bits have changed in value.

The comparison is carried out by first XORing the Old and New states of the keyboard. The result of the XOR is then ANDed with the New state of the Keyboard. The result of this AND determines the next step. If there are two high bits set in the result, then the result can be directly translated to the corresponding key code and the appropriate "break" signals can be sent. If only one bit is set, then the algorithm must proceed to the Case 3 handler (see below) to determine the key code that will be used in the break signal. If no bits are set, then no keys have been released. If more than two bits are set, then more than one key has been released and the keyboard should transition to the Ghost state.

Example—overlapping key press/step-wise termination:

Key α—A1–B2 is down.

Key β—C3–D4 is down and just being released.

|  | A | B | C | D |  |
|---|---|---|---|---|---|
| Old | 01111 | 10111 | 11011 | 11101 | α and β down |
| New | 01111 | 10111 | 11111 | 11111 | α down |

|  | A | B | C | D |  |
|---|---|---|---|---|---|
| XOR | 00000 | 00000 | 00100 | 00010 |  |
| AND(XOR, OLD) | 00000 | 00000 | 00100 | 00010 | Result |

The Result can be used to discriminate C3–D4 (the β key).

Example—two keys simultaneously released:

Key α—A1–B2 is down and is just being released.

Key β—C3–D4 is down and is just being released.

|  | A | B | C | D |  |
|---|---|---|---|---|---|
| Old | 01111 | 10111 | 11011 | 11101 |  |
| New | 11111 | 11111 | 11111 | 11111 |  |
| XOR | 10000 | 01000 | 00100 | 00010 |  |
| AND(XOR, NEW) | 10000 | 01000 | 00100 | 00010 | Result |

The Result is A1–B2–C3–D4, which does not properly translate to a key. Since there are more than two bits set, the keyboard would transition to the Ghost state. However, since the keyboard knows which keys were down, and now knows that no keys are down, it can send break codes for the two keys that were down.

Case 3: A key is pressed or released and shares an identification bit with another key that is already pressed.

When a key is pressed and it shares an identification bit with a key that is already pressed, then the comparison done in Cases 1 and 2 is not sufficient to identify which key was most recently pressed. Here the algorithm will do one of two things:

1. Determine which bit is being shared; or
2. Determine that the shared bit cannot be identified and go to the Ghost state.

In accordance with the invention, an attempt is made to find the bit paired to an already known single bit, so that a correct key code can be determined. If the matrix is set up such that all key patterns use adjacent sense lines (as has been described), it may be possible to determine if the unknown bit is being used by another key. When a first key is pressed, then a the second key is pressed having a switch sharing a bit with the switch of the first key, exactly one new 0 bit will appear, and it will be on a sense line adjacent to only one of the previous 0 bits. A mask is used to identify which bit of the previous code is on a sense line adjacent to the new bit, and thus identify the shared line, and then deduce the entire code for the new key. The first step in this process is to create a MASK signal. The MASK signal is a data set containing 1's in the possible locations of the matching bit.

Example:

| Single known bit | 000100 | Single known bit | 000010 |
|---|---|---|---|
| Mask | 001010 | Mask | 000101 |

The "1" bits in the Mask occur to the left and to the right of the single known bit. This mask is then ANDed with the complement of the New state register. The result of this operation should result in a single bit, which when paired with the single known bit can be translated into the correct key code. These bits are put together with an OR. If the result of the AND of the Mask and the complemented New registers contains more than 1 bit high, then there is more than one potential match to the single known bit, and it is impossible to tell which of these multiple bits is the correct matching bit. Accordingly, the algorithm should transition to the Ghost state.

Example:
Key α—A1–B2 is down.
Key β—B2–C3 is just being pressed.

|  | A | B | C |  |
|---|---|---|---|---|
| Old | 01111 | 10111 | 11111 | α down |
| New | 01111 | 10111 | 11011 | α and β down |
| XOR | 00000 | 00000 | 00100 |  |
| AND(XOR, OLD) | 00000 | 00000 | 00100 |  |
| Mask | 01010 | 01010 | 01010 |  |
| And(Mask, ~New) | 00000 | 01000 | 00000 |  |
| Or | 00000 | 01000 | 00100 | Result |

The Result is B2–C3, which is the correct code for the β key. Note that the mask was used to identify bit 2 and bit 4 as possible matches, which resulted in B2 as the correct second bit.

Case 4: Illegal "bridged" state. The algorithm should identify that an invalid state has been reached and transition to the Ghost state.

A bridge condition occurs when a drive line is connecting two sense lines and another drive line attempts to use one of those sense lines. The signal from the second drive line will use the first drive line as a bridge and incorrectly pass the signal to both sense lines. This will prevent the correct translation of the keys that are pressed. This situation is handled in either Case 1 or Case 2. If bridging occurs, then more than two bits will be set after the XOR and the AND steps. As specified above, if more than two bits are set then the algorithm may go into the Ghost condition.

Case 5: Exiting the Ghost state.

The exit condition of the Ghost state can be determined by examining the New state of the keyboard. Condition #1—if the New state contains 0 low bits, then the keyboard has no keys pressed. Condition #2—if the New state has 2 bits set, then there is a single detectible key pressed. The keyboard can correctly detect these conditions once the Old state is set to all 1's. Therefore, once a Ghost state is entered the Old registers are automatically set to all 1's. Thus, if the Old state is the Ghost state and the number of low bits in the New state is 0 or 2, then the keyboard can correctly perform key detection and continue normal operation.

What follows is a text description of an exemplary routine for executing a subtraction algorithm in accordance with the invention:

Key scanning is performed and the data is saved into New Status Registers.

1. If a Ghost condition exists, then a check is performed to see if the Ghost condition has been exited. If yes, the Ghost Condition Flag is cleared and control proceeds to step 2. If the condition is not cleared, then the check maintains the Ghost condition and skips the rest of the routine (go to Step 7).
2. A check is done to see if a new key has been pressed. (Performing this check prior to the release check (step 3) allows for a hidden key which was pressed to get a make code, before one of the keys that was hiding it gets a break code.)
   a. If more than two bits are set, then the Ghost Condition Flag is set (step 6) unless the new state indicates no keys are pressed. If this is the case, appropriate key codes are formed, the keys are removed from the Key_Buffer, and the key bits are Ored into a New register. Control then skips to step 4.
   b. If no bits are set, then no new key has been pressed, and control proceeds to step 3.
   c. If two bits are set, then a single valid key press has been obtained. A key code is formed the key is and put into Key_Buffer. Control then proceeds to step 3.
   d. If one bit is set, then a mask (as previously described) is used to try to find the matching second bit.
      i. If successful, a key code is retrieved and added to the buffer. Control then process to step 3.
      ii. If unsuccessful, the Ghost condition is set (step 6).
3. A check is done to see if a key has been released.
   a. If more than two bits are set, then the Ghost Condition Flag is set (step 6) unless the new state indicates no keys are pressed. If this is the case, appropriate key codes are formed, the keys are removed from the Key_Buffer, and the key bits are Ored into a New register. Control then skips to step 4.
   b. If no bits are set, then no key was released and the algorithm skips to changing the New State to Old (step 4).
   c. If two bits are set, then a single valid key release has been obtained. A key code is formed, the key is removed from Key_Buffer and the key bits are ORed into a New register. Control then skips to step 4.
   d. If one bit is set, then a mask used to try to find the matching second bit.
      i. If successful, a key code is obtained and removed from the buffer.
         The Key bit is ORed into the New Registers, and control proceeds to step 4.
      ii. If unsuccessful, a Ghost condition is set and control skips to step 6.
4. Once the routine reaches this point, the pressed and released keys have been successfully calculated, and their status updated.
5. Now the New_Reg Registers are saved into the Old_Reg Registers, since the new status will become the old status for the next Key_Scan. Go to step 7.
6. The Ghost flag bit is set and all 1's are saved into the Old_Reg Registers.
7. Routine RETURNS.

When a subtraction algorithm is implemented in accordance with the invention, the matrix can make a proper key discrimination even under illegal simultaneous key press conditions (two keys, or more than two keys in some cases). If cases arise that prevent proper key detection, then the algorithm will go into the Ghost state until a known state of one or no keys pressed is reached. Cases that may give rise to error states are described below.

Generally, the algorithm will be able to properly detect a maximum of one key change up and one key change down for every new key scan. This is because of the XOR step in the process. The purpose of the XOR is to isolate which two bits have changed and update the corresponding key status. If more than two bits change, it is impossible to isolate which bits correspond to which key action from the perspective of the microprocessor.

Figure 13:
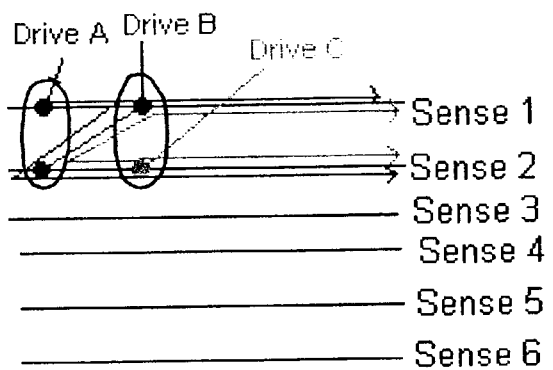
FIG. 13 is a schematic depiction of an error condition that may arise due to "bridging" drive line/sense line contacts.

The subtraction algorithm will be unable to detect proper key presses if one drive line is contacting two sense lines, and a separate drive line is contacting one of those two sense lines. This occurs because the drive line contacting two sense lines acts as a bridge between these sense lines. Another drive line attempting to signal on either of these lines will inadvertently (and incorrectly) have its signal branch to both sense lines. An example of this failure is illustrated in FIG. 13.

In the illustrated case, Drive B is connected to Sense 1 and Sense 2. This forms a signal bridge between the two sense lines and prevents the other signals on the lines from propagating correctly. Notice that the signal from Drive A is passed across this bridge from Sense 1 to Sense 2. Similarly, the signal from Drive C is bridged from Sense 2 to Sense 1. When the actual Key Scan is performed, the following signal will be read in:

| A1-6 | B1-6 | C1-6 |
|---|---|---|
| 001111 | 001111 | 001111 |

While the correct code for these keys should be:

| A1-6 | B1-6 | C1-6 |
|---|---|---|
| 011111 | 001111 | 101111 |

Note that there is an extra low in A2 and C1, where the incorrect signal crossed the bridge. "Hidden" keys will not be properly detected under certain conditions. For example, say:

Key α=B1–A2
Key β=C2–B3
Key γ=A2–B3

Figure 14:
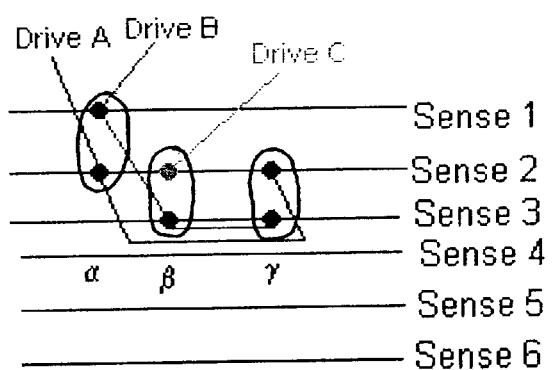
FIG. 14 is a schematic depiction of another bridging condition that may arise.

If both Key α and Key β are pressed, then it will not be possible to detect if Key γ is pressed. This is because the signal bits for Key γ, A2 and B3, are already used by other pressed keys. This is a more complex version of the bridging condition described above. In general, such three key combinations not involving a modifier key are rare. In this case, both identification bits are already in use. This can be handled by ignoring Key γ, until either the Key α or Key β are released. The above example is depicted in FIG. 14. If Key α and Key β are pressed, then the following identification bits are being used: A2, B1, B3, C2. The bits are already low in the current state. When Key γ is pressed, it attempts to drive A2 and B3 low. This is impossible since they are already forced low by the α and β other keys. Therefore, Key γ will be ignored since its identification bits are already being used.

In the above example, when α and β are pressed, γ is hidden "behind" those keys. When β is released, Bit D4 will change to high while bit C3 will remain low. In this case, there will be no bit changing from high to low, and therefore nothing to trigger the XOR to make it see γ as a key that is being pressed down. Therefore, when the β key is released, its two bits C3–D4 should be saved as high in the Old register. Thus, when the next New read is done, C3 will be seen as going from the high to low state and thus be able to detect γ.

|  | A | B | C | D |  |
|---|---|---|---|---|---|
| A Problem Scenario: | | | | | |
| Old1 | 011111 | 101111 | 110111 | 111011 . . . | α, β and γ down |
| New1 | 011111 | 101111 | 110111 | 111111 . . . | β up (α & γ down) |
| Old2 | 011111 | 101111 | 110111 | 111111 . . . | this was New1 |
| New2 | 011111 | 101111 | 110111 | 111111 . . . | α and γ still down |
| XOR | 000000 | 000000 | 000000 | 000000 . . . | γ key still not detected |
| A Solution: | | | | | |
| Old1 | 011111 | 101111 | 110111 | 111011 . . . | |
| New1 | 011111 | 101111 | 110111 | 111111 . . . | |
| Old2 | 011111 | 101111 | 111111 | 111111 . . . | New1 Ored with B(C3D4) |
| New2 | 011111 | 101111 | 110111 | 111111 . . . | |
| XOR | 000000 | 000000 | 001000 | 000000 . . . | now C3 is triggered and γ is seen as down. |

When a key is released, its two identification bits should be ORed into the upcoming old state. This allows keys which are hidden to be detected as if they are being pressed in the next key scan. If this operation is not performed, then the identification bits (C3) would not be detected by the XOR. By ORing in the released key, the hidden key is given the opportunity to cause a bit change in the XOR as though it had been just pressed.

Alternative Embodiments of the 2/2 Solution

Switching Drive and Sense Lines

There is no change in functionality arising from a switch of sense and drive lines. In the exemplary embodiment, since there are six of each, the result is six reads of six bits of data, i.e., a 36-bit string either way.

Varying the Number of Sense line and Drive Lines

The number of sense lines and drive lines can be increased or decreased in accordance with the required number of keys. For example, the addition of a seventh sense line would increase the number of key combinations to twelve (from ten) for any pair of drive lines, thus increasing the number of detectible keys for six drive lines (A–F), from 150 to 180 keys, at the expense of an increase of one in the pin count. Addition of a seventh sense line would also allow the advantages of the three-drive-line modifier key matrix but with only two drive lines, since the single key on drive line I would be moved to the new sense line.

Additional Sense Line Trace

Figure 15:
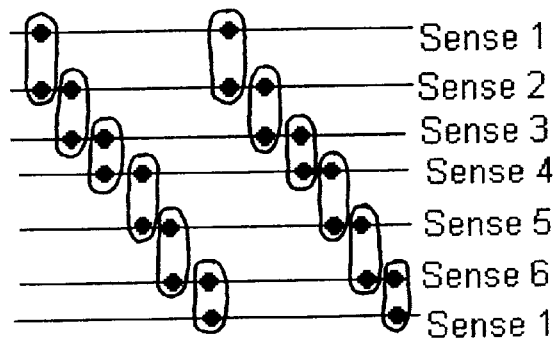
FIG. 15 is a schematic depiction of an alternative embodiment of the 2/2 Solution, including a second trace of a first sense line.

Another way to increase the number of keys per pair of drive lines is to add an additional trace of an existing sense line, e.g., Sense 1, as shown in FIG. 15. This would mean, e.g., extending the Sense 1 trace next to the Sense 6 trace. This would then allow each drive line to have a 1 and 6 contact pattern, for example, A1–B6. This would allow Sense 1 to form two contact patterns (1–6 and 1–2), instead of just one (1–2). In turn, this would allow each pair of drive lines to detect twelve keys instead of ten, and increase the overall detectible number of non-modifier keys (for six drive lines) to 180 (15 drive line pairings×12 keys per drive line pair). The twelve contacts could be arranged as shown in FIG. 15. With twelve keys now detectible by a pair of sense lines, it may be possible to drop a drive line (e.g., go from six drive lines to five) and still have sufficient key discrimination capacity for a typical computer keyboard application. Five drive lines can create ten distinct pairs of drive lines (AB, AC, BC, AD, BD, CD, AE, BE, CE, DE). These ten pairs of drive lines could detect 120 keys. If two more drive lines are added to discriminate twelve special keys, a total of 132 keys can be detected using seven drive lines and six sense lines. This is an overall pin count of thirteen, which can detect all possible 131 keys of, e.g., the Microsoft Internet Keyboard Pro or Natural Keyboard Pro keyboards, and also meet WHQL standards.

A drawback of the above-described reduced drive line option is that it may cause a lessened impact of the subtraction algorithm, because of the smaller number of diverse key contacts. Essentially, there would be more overlap of key codes and therefore the previously described subtraction algorithm would improve functionality to a lesser degree.

Use of Extra Matrix Points

The above-described exemplary implementation of the 2/2 Solution includes a matrix that uses a total of fourteen pins. Typically, there may be sixteen pins available that can be used indirectly to improve key discrimination. If a larger matrix is provided to support the same number of keys, some points in the matrix will be empty. Knowing this, the firmware can then logically eliminate "ghosts" that include an empty spot. As previously explained, a ghost occurs when three of four switches that form the corners of a rectangle in the matrix are closed. If one of those switches does not exist, then firmware can deduce that the other three switches are down and report them properly. Thus, if 130 keys are to be supported and a matrix that supports 180 keys is provided, then there are fifty ghost combinations that can be eliminated by firmware.

WHQL Compliance

The 2/2 Solution can be implemented to WHQL standards. As explained above, those standards require that a set of special keys (used in two key and three key combinations) must be detectible individually and in pairs. More specifically, WHQL requires that any one of the keys be detectable with any one key from a table of Valid Final Keys for two key combinations, and that certain combinations of two of the modifier keys be detectable when pressed together with any one key from the Valid Final Keys. Since all of the Valid Final Keys can be made to fall along drive lines A–F, any one of these keys can be detected independently of the status of the special keys. Similarly, any one of the special keys, and any pair of the special keys, can be detected as long as no more than one key from the A–F matrix is pressed.

The present invention has been described in terms of preferred and exemplary embodiments thereof. Numerous other embodiments, modifications and variations within the scope and spirit of the appended claims will occur to persons of ordinary skill in the art from a review of this disclosure.

What is claimed is:

1. A keyboard switch matrix for use in keyboard key discrimination, comprising:
   a plurality of drive lines;
   a plurality of sense lines; and
   a plurality of switches for selectively causing contact between the drive lines and sense lines upon actuation of associated keyboard keys, wherein:
   a first set of said plurality of switches is arranged to bring into exclusive contact, upon actuation of an associated key, a first drive line with a first sense line and a second drive line with a second sense line whereby upon sequentially driving signals on said plurality of drive lines in a cyclical manner and sensing said signals that appear on said plurality of sense lines, an actuated key can be discriminated based upon said signals.

2. The keyboard switch matrix of claim 1, wherein a second set of said plurality of switches is arranged to bring into exclusive contact, upon actuation of an associated key, one of:
   said first drive line with said second sense line and said second drive line with a third sense line; and
   said first sense line with said second drive line and said second sense line with a third drive line.

3. The keyboard switch matrix of claim 2, wherein a third set of said plurality of switches is arranged to bring into exclusive contact, upon actuation of an associated key, one of:
   said first drive line with said third sense line and said second drive line with a fourth sense line; and
   said first sense line with said third drive line and said second sense line with a fourth drive line.

4. The keyboard switch matrix of claim 3, wherein a fourth set of said plurality of switches is arranged to bring into exclusive contact, upon actuation of an associated key, one of:
   said first drive line with said fourth sense line and said second drive line with a fifth sense line; and
   said first sense line with said fourth drive line and said second sense line with a fifth drive line.

5. The keyboard switch matrix of claim 4, wherein a fifth set of said plurality of switches is arranged to bring into exclusive contact, upon actuation of an associated key, one of:
   said first drive line with said fifth sense line and said second drive line with a sixth sense line; and
   said first sense line with said fifth drive line and said second sense line with a sixth drive line.

6. The keyboard switch matrix of claim 1, wherein a second set of said plurality of switches is arranged to bring into exclusive contact, upon actuation of an associated key, a single drive line with a single sense line.

7. A keyboard switch circuit for providing key discrimination among a plurality of keyboard keys, the switch circuit comprising:
   a switch matrix comprising a plurality of drive lines, a plurality of sense lines and a plurality of switches for selectively causing contact between the drive lines and sense lines upon actuation of associated keyboard keys, wherein a first set of said plurality of switches is arranged to bring into exclusive contact, upon actuation of an associated key, a first drive line with a first sense line and a second drive line with a second sense line; and an integrated circuit (IC) coupled to the plurality of drive lines and sense lines, the IC comprising logic circuitry for:

sequentially driving signals on said plurality of drive lines in a cyclical manner, and sensing said signals that appear on said plurality of sense lines; and discriminating an actuated key based upon said signals.

8. The keyboard switch circuit of claim 7, wherein a second set of said plurality of switches is arranged to bring into exclusive contact, upon actuation of an associated key, one of:

said first drive line with said second sense line and said second drive line with a third sense line; and said first sense line with said second drive line and said second sense line with a third drive line.

9. The keyboard switch circuit of claim 8, wherein a third set of said plurality of switches is arranged to bring into exclusive contact, upon actuation of an associated key, one of:

said first drive line with said third sense line and said second drive line with a fourth sense line; and said first sense line with said third drive line and said second sense line with a fourth drive line.

10. The keyboard switch circuit of claim 9, wherein a fourth set of said plurality of switches is arranged to bring into exclusive contact, upon actuation of an associated key, one of:

said first drive line with said fourth sense line and said second drive line with a fifth sense line; and said first sense line with said fourth drive line and said second sense line with a fifth drive line.

11. The keyboard switch circuit of claim 10, wherein a fifth set of said plurality of switches is arranged to bring into exclusive contact, upon actuation of an associated key, one of:

said first drive line with said fifth sense line and said second drive line with a sixth sense line; and said first sense line with said fifth drive line and said second sense line with a sixth drive line.

12. A keyboard switch circuit according to claim 7, wherein a second set of said plurality of switches is arranged to bring into exclusive contact, upon actuation of an associated key, a single drive line with a single sense line.

13. A keyboard switch circuit according to claim 7, wherein said logic circuitry implements a subtraction algorithm serving to read a new status of the keyboard and compare it to an old status to detect any new key presses or releases.

14. A method for keyboard key discrimination, comprising:

sequentially driving signals on a plurality of drive lines of a switch matrix in a cyclical manner;

sensing said signals that appear on a plurality of sense lines of said switch matrix as a result of a first drive line coming into exclusive contact with a first sense line and a second drive line coming into exclusive contact with a second sense line; and discriminating an actuated key based upon said signals.

15. A method according to claim 14, further comprising reading a new status of the keyboard and comparing it to an old status to detect any new key presses or releases.

* * * * *